United States Patent [19]

Miyafuji et al.

[11] Patent Number: 4,687,633
[45] Date of Patent: Aug. 18, 1987

[54] LEAD MATERIAL FOR CERAMIC PACKAGE IC

[75] Inventors: Motohisa Miyafuji, Shimonoseki; Tateo Yuchi, Kitakyushu; Riichi Tsuno, Shimonoseki, all of Japan

[73] Assignee: Kabushiki Kaisha Kobe Seiko Sho, Kobe, Japan

[21] Appl. No.: 816,897

[22] Filed: Jan. 7, 1986

[30] Foreign Application Priority Data

Feb. 1, 1985 [JP] Japan .................................. 60-18432
Feb. 1, 1985 [JP] Japan .................................. 60-18431

[51] Int. Cl.$^4$ ............................................. C22C 9/04
[52] U.S. Cl. ..................... 420/481; 420/471; 420/472; 420/473; 420/479
[58] Field of Search ............... 420/481, 471, 472, 473, 420/479; 148/433, 434

[56] References Cited

U.S. PATENT DOCUMENTS 4,366,117 12/1982 Tsuji ..................................... 420/481
4,427,627 1/1984 Guerlet et al. ...................... 420/496

FOREIGN PATENT DOCUMENTS 2123851 2/1984 United Kingdom .
2159836 12/1985 United Kingdom .

*Primary Examiner*—R. Dean
*Attorney, Agent, or Firm*—Oblon, Fisher, Spivak, McClelland & Maier

[57] ABSTRACT

A lead material for ceramic package ICs which comprises Ni 1.0–5.0 wt %, Co 0.2–1.0 wt %, Si 0.2–1.5 wt %, Zn 0.1–5.0 wt %, Cr 0.001–0.1 wt %, and Mn 0.02–1.0 wt %, with the remainder being Cu and inevitable impurities. It does not cause cracking to the ceramic substrate in the cooling step after silver soldering at 800° to 950° C., even though its coefficient of thermal expansion differs from that of ceramics. Moreover, it retains its high strength and conductivity after brazing.

7 Claims, 1 Drawing Figure

No. 2    INVENTION    No. 6

COMPARATIVE
No. 9                     No. 11

INVENTION

No. 2

No. 6

COMPARATIVE

No. 9

No. 11

LEAD MATERIAL FOR CERAMIC PACKAGE IC

BACKGROUND OF THE INVENTION

1. Field of the Invention

The present invention relates to a lead material for ceramic package ICs. More particularly, it relates to a lead material for the side-brazed leadframe of dual-in-line ceramic package and for the lead wire of pin-grid array IC. The lead material is made into input/output terminals after brazing with heating at 800° to 900° C. After brazing, it has a Vickers' hardness of at least 130.

2. Discussion of the Background

Usually, the substrate of side-brazed ICs is made of ceramics and the metallized parts on both sides of the substrate are connected to the leadframe as the terminals by silver soldering.

The material of the leadframe is the Fe-42Ni alloy (F-30 alloy of ASTM Standards). This alloy is used because it has a coefficient of thermal expansion close to that of ceramics and it does not apply strain to (and hence does not cause damage to) the ceramic substrate during the cooling process after silver soldering at 800° to 900° C. This F-30 alloy has an advantage that it has a Vickers' hardness higher than 130 even after brazing at 800° to 900° C.

On the other hand, this F-30 alloy has a disadvantage of its low electric conductivity, i.e., 3% IACS. Accordingly, it has a low thermal conductivity and is liable to generate Joule heat when used as a lead material for ICs and is poor in dissipation of heat generated in the IC elements.

There has been a demand for a new material to replace the F-30 alloy poor in heat dissipation, because recent ICs generate more heat than before as the density of elements increases.

A material that meets this requirement is a copper alloy. However, it has a serious drawback in that it softens and loses its strength as the result of heating for silver soldering at 800° to 900° C. In addition, a copper alloy superior in strength and heat resistance has a low conductivity as with F-30 alloy.

In the case of pin-grid array IC, the headed wire and the metallized electrode are connected together by silver soldering at 800° to 900° C. as in the case of side-brazed IC. Except that the leadframe for side-brazing is made of strip, both the leadframe and the wire receive the same strain due to cooling after brazing. The lead made of F-30 alloy now in use for pin-grid array ICs is poor in heat dissipation as mentioned above, and there has been a demand for a new material to replace it.

The present invention was made to overcome the disadvantages of F-30 alloy or a copper alloy as a substitute of F-30 alloy which has been used as a lead material for ceramic package ICs, e.g., side-brazed ICs of dual-in-line type ceramic package and pin-grid array ICs.

SUMMARY OF THE INVENTION

Accordingly, it is an object of the present invention to provide a lead material for ceramic package ICs which does not cause damage to the ceramic substrate in the cooling process after silver soldering at 800° to 900° C. and retains its strength, resistance to repeated flexing, electric conductivity, and thermal conductivity after silver soldering. Moreover, the lead material is superior in hot working performance, solderability, and peel resistance under heating for soldering. It has a crystal grain size of 50 $\mu$m.

DETAILED DESCRIPTION OF THE INVENTION

Figure 1:
FIG. 1 shows the electron micrographs of the structure of the lead material of this invention and a comparative material.
Figure 1:
Figure 1:
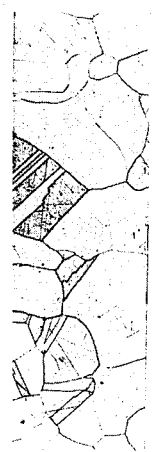
Figure 1:
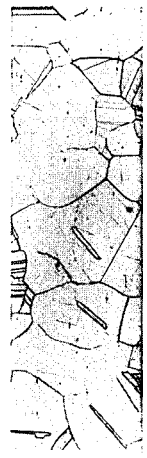

The first invention disclosed herein is concerned with a lead material for ceramic package ICs which comprises Ni 1.0–5.0 wt%, Co 0.2–1.0 wt%, Si 0.2–1.5 wt%, Zn 0.1–5.0 wt%, Cr 0.001–0.1 wt%, and Mn 0.02–1.0 wt%, with the remainder being Cu and inevitable impurities.

The second invention disclosed herein is concerned with a lead material for ceramic package ICs which comprises Ni 1.0–5.0 wt%, Co 0.2–1.0 wt%, Si 0.2–1.5 wt%, Zn 0.1–5.0 wt%, Sn 2.0 wt% or less, Cr 0.001–0.1 wt%, and Mn 0.02–1.0 wt%, with the remainder being Cu and inevitable impurities.

A detailed description is given below of the lead material for ceramic package ICs. The alloying elements and their ratio in the lead material are explained first.

Ni, Co, and Si are elements that increase strength. Ni, alone or in combination with Co, forms an intermetallic compound with Si, contributing to the increase of strength.

Satisfactory strength is not obtained if the Ni content is less than 1.0 wt% and the Si content is less than 0.2 wt%, even though the Co content exceeds 1.0 wt%. As the Ni and Si content is increased, the lead material has sufficient strength and conductivity even after brazing at 800° to 900° C. But this effect levels off when the Ni content exceeds 5.0 wt%. When the Si content exceeds 1.5 wt%, the lead material becomes poor in hot working performance. Thus the Ni content should be 1.0 to 5.0 wt%, and the Si content should be 0.2 to 1.5 wt%. For balanced strength and conductivity, the ratio of Ni content to Si content should preferably be 4:1 to 6:1.

Co, like Ni, contributes to the improvement of strength. It inhibits the growth of crystal grains at the time of brazing at 800° to 900° C. If the crystal grains become larger than 50 $\mu$m after brazing at 800° to 900° C., the lead material is poor in resistance to repeated flexing, surface appearance, and fatigue strength. With the Co content less than 0.2 wt%, the above-mentioned effect is not remarkable. The Co content in excess of 1.0 wt% brings about a cost increase; and its effect is relatively small for the increased cost. Thus the Co content should be 0.2 to 1.0 wt%.

Zn is an essential element to improve the thermal peel resistance of tin or tin alloy plating on the lead surface. With a content less than 0.1 wt%, this effect is little, and with a content in excess of 5.0 wt%, the lead material is poor in solderability. Thus the Zn content should be 0.1 to 5.0 wt%, preferably 0.2 to 0.5 wt%.

Cr strengthens the grain boundary in ingot and improves the hot working performance. With a content less than 0.001 wt%, this effect is little, and with a content in excess of 0.1 wt%, the molten metal oxidizes and becomes poor in castability. Thus the Cr content should be 0.001 to 0.1 wt%.

Mn also improves the hot working performance. With a content less than 0.02 wt%, this effect is little, and with a content in excess of 1.0 wt%, the molten metal is poor in flowability and decreases casting yields to a great extent. Thus the Mn content should be 0.02 to 1.0 wt%.

In the meantime, the copper alloy of this invention may contain Sn. Sn forms a solid solution with Cu to improve the strength and elongation of the alloy and also improves the resistance to repeated flexing. If the Sn content exceeds 2 wt%, the alloy is poor in hot working performance and low in conductivity. Thus the Sn content should be less than 2.0 wt%.

In addition to the above-mentioned effective elements, the alloy may contain up to 0.2 wt% of Ag, Al, In, and Fe alone or in combination, and up to 0.1 wt% of B, Be, Mg, Ti, Zr, and P alone or in combination. They have no adverse effect on hot working performance, silver solderability, tensile strength, conductivity, solderability, peel resistance under heating for soldering, and resistance to repeated flexing.

The lead material for ceramic package ICs may be produced from the above-mentioned copper alloy by hot working such as rolling and extrusion, cold working such as rolling and drawing, and annealing. These steps are not limitative. The cooling rate after brazing is not critical so long as it is slow enough to prevent ceramics from cracking. The copper alloy of this invention has a coefficient of thermal expansion greater than that of the ceramic package; nevertheless, it will not cause damage to the ceramic substrate during silver soldering and cooling, because the silver soldering of the lead pin is accomplished in a very narrow area.

The lead material for ceramic package ICs increases in hardness and conductivity when it undergoes heat treatment at 400° to 550° C. for 5 to 30 minutes after silver soldering. This heat treatment is accomplished by the glass sealing step in the manufacturing of ceramic package ICs. This heat history ensures high strength and conductivity. The reason for this is that when the lead material passes through the temperature zone of 400° to 550° C. in the cooling step after brazing the mother alloy is strengthened and purified by (Ni$_{1-x}$Co$_x$)$_2$Si that separates out at 400° to 550° C. during cooling.

EXAMPLES

The invention is now illustrated with the following examples. Each of the copper alloys of the compositions shown in Table 1 was melted in a kryptol furnace under the charcoal covering in the atmosphere. The molten metal was cast into a book mold of cast iron measuring 60 mm thick, 60 mm wide, and 180 mm long.

(Alloys Nos. 20 and 21 for comparison were poor in castability and casting yield due to the Mn content in excess of 1.0 wt%, and they did not undergo subsequent steps. Alloys Nos. 24 and 25 for comparison, each containing more than 0.1 wt% of Cr, were also poor in castability and casting yield due to excessive oxidation of molten metal, and they did not undergo subsequent steps.)

Both sides of the ingot were scraped off to a depth of 5 mm. The ingot was made into a 10 mm thick plate by hot rolling at 850° C., followed by descaling. Subsequently, the plate was made into a 0.25 mm thick sheet by cold rolling.

(Plates made from alloys Nos. 18 and 19, each containing less than 0.02 wt% of Mn, cracked during hot rolling, and they did not undergo subsequent steps. Plates made from alloys Nos. 22 and 23, each containing no Cr, cracked during hot rolling, and they did not undergo subsequent steps.)

Comparative alloy No. 26 is commercial F-30 alloy.

TABLE 1

| No. | Ni | Si | Co | Zn | Sn | Mn | Cr | Cu |
|---|---|---|---|---|---|---|---|---|
| 1 | 1.62 | 0.36 | 0.25 | 0.31 | 0 | 0.032 | 0.003 | Balance |
| 2 | 1.66 | 0.41 | 0.43 | 0.29 | 0 | 0.035 | 0.005 | Balance |
| 3 | 1.60 | 0.36 | 0.65 | 0.30 | 0 | 0.038 | 0.006 | Balance |
| 4 | 1.64 | 0.38 | 0.94 | 0.31 | 0 | 0.036 | 0.003 | Balance |
| 5 | 1.62 | 0.40 | 0.25 | 0.28 | 0.51 | 0.029 | 0.005 | Balance |
| 6 | 1.63 | 0.41 | 0.45 | 0.29 | 0.52 | 0.039 | 0.005 | Balance |
| 7 | 1.65 | 0.39 | 0.93 | 0.31 | 0.51 | 0.032 | 0.006 | Balance |
| 8 | 1.62 | 0.38 | 0.43 | 0.33 | 1.53 | 0.035 | 0.007 | Balance |
| 9* | 1.63 | 0.37 | 0.11 | 0.29 | 0 | 0.036 | 0.008 | Balance |
| 10* | 1.62 | 0.40 | 1.05 | 0.30 | 0 | 0.038 | 0.007 | Balance |
| 11* | 1.65 | 0.39 | 0.12 | 0.30 | 0.53 | 0.038 | 0.005 | Balance |
| 12* | 1.63 | 0.38 | 0.68 | 0.33 | 0.51 | 0.038 | 0.005 | Balance |
| 13* | 1.61 | 0.38 | 0.43 | 0.32 | 2.10 | 0.036 | 0.006 | Balance |
| 14* | 1.60 | 0.37 | 0.42 | 0.04 | 0 | 0.039 | 0.005 | Balance |
| 15* | 1.63 | 0.39 | 0.43 | 0.05 | 0.51 | 0.039 | 0.004 | Balance |
| 16* | 1.62 | 0.41 | 0.42 | 5.13 | 0 | 0.038 | 0.005 | Balance |
| 17* | 1.65 | 0.42 | 0.41 | 5.09 | 0.50 | 0.035 | 0.006 | Balance |
| 18* | 1.63 | 0.39 | 0.43 | 0.29 | 0 | 0.008 | 0.006 | Balance |
| 19* | 1.62 | 0.39 | 0.44 | 0.30 | 0.49 | 0.009 | 0.008 | Balance |
| 20* | 1.62 | 0.38 | 0.42 | 0.28 | 0 | 1.12 | 0.005 | Balance |
| 21* | 1.61 | 0.37 | 0.43 | 0.29 | 0.53 | 1.10 | 0.006 | Balance |
| 22* | 1.63 | 0.38 | 0.43 | 0.32 | 0 | 0.035 | 0 | Balance |
| 23* | 1.64 | 0.38 | 0.44 | 0.31 | 0.52 | 0.034 | 0 | Balance |
| 24* | 1.65 | 0.40 | 0.41 | 0.33 | 0 | 0.038 | 0.12 | Balance |
| 25* | 1.64 | 0.42 | 0.41 | 0.30 | 0.49 | 0.036 | 0.13 | Balance |
| 26* | Fe-42% Ni alloy (F-30 alloy) | | | | | | | |

*Comparative alloys

To simulate the connecting of a wire to a metallized electrode on the ceramic substrate with silver solder of Ag-28% Cu eutectic alloy, the sample sheet was heated at 850° C. for 5 minutes and cooled to room temperature at a rate of about 14° C./min and finally subjected to heat treatment at 500° C. for 15 minutes. The heat-treated sample sheet was examined for solderability, resistance to peeling under heating for soldering, crystal grain size, conductivity, tensile strength, elongation, Vickers' hardness, stiffness, and resistance to repeated flexing.

The test methods used are as follows:

(1) Solderability and peeling by soldering heat were evaluated according to MIL STD-202E, Method 208C. The specimen was soldered in a solder bath of Sn60-Pb40 at 230° C. under a low-active flux. After standing at 150° C. for 500 hours in the atmosphere, the specimen was bent 90° to check the adhesion of solder.

(2) Conductivity was measured using a double bridge and calculated according to the average cross section method.

(3) Tensile strength was measured using a test piece conforming to ASTM E8 cut in parallel to the rolling direction. Hardness was measured with a micro-Vickers hardness meter under a load of 300 g.

(4) Stiffness was measured using a test piece measuring 0.25 mm thick, 10 mm wide, and 60 mm long, cut parallel to the rolling direction. Stiffness is expressed as a bending moment required for the specimen to reach a displacement angle of 20° when bent into a radius of curvature of 40 mm.

(5) Resistance to repeated flexing was measured using an actual press punched leadframe having an internal lead width of 1.5 mm and an external lead width of 0.5 mm. The test consists in bending the lead through 90° both ways in one direction, with a 227 g weight suspending from one end of the external lead, until rupture occurs. The result is reported as the number of bends (made in both ways) before failure. An average value for five specimens is indicated. The direction of bending is parallel to the rolling direction.

In Table 2, the alloys of this invention are compared with the comparative alloys with respect to solderability and resistance to peel after heating for soldering.

| No. | Solderability | Resistance to peeling |
|---|---|---|
| 1 | Good | Good |
| 2 | Good | Good |
| 3 | Good | Good |
| 4 | Good | Good |
| 5 | Good | Good |
| 6 | Good | Good |
| 7 | Good | Good |
| 8 | Good | Good |
| 9* | Good | Good |
| 10* | Good | Good |
| 11* | Good | Good |
| 12* | Good | Good |
| 13* | Good | Good |
| 14* | Good | Partly peeled |
| 15* | Good | Partly peeled |
| 16* | Poor | — |
| 17* | Poor | — |
| 26* | Good | Good |

*Comparative alloys

It is noted from Table 2 that the lead material for ceramic package ICs mentioned herein is superior in solderability and solder retention, and thus it has an extremely high reliability.

Comparative alloys Nos. 16 and 17 each containing more than 5 wt% of Zn were poor in solderability and comparative alloys Nos. 14 and 15 each containing less than 0.1 wt% caused peeling after heating for soldering.

The sheet specimens prepared from respective alloys were examined for conductivity, tensile strength, elongation, Vickers' hardness, stiffness, repeated flexing, and crystal grain size. The results are shown in Table 3 and FIG. 1.

It is noted from Table 3 and FIG. 1 that the lead material for ceramic package ICs mentioned herein is superior in every respect. Alloys Nos. 1 to 8 of this invention and comparative alloys Nos. 10, 12, and 13, each containing more than 0.2 wt% of Co, are superior in crystal grain size to comparative alloys Nos. 9 and 11, each containing less than 0.2 wt% of Co. The crystal grain size was finer than 50 μm when measured after heating under the same conditions as silver soldering (at 850° C. for 5 minutes). This is approximately equal to that of comparative alloy No. 26. Comparative alloys Nos. 10 and 12 each containing more than 1.0 wt% of Co provided fine crystal grain sizes; but they are not preferable for economical reason.

Alloys Nos. 1 to 4 each containing more than 0.2 wt% of Co increased in Vickers' hardness in excess of 110 after silver-soldering; and the hardness further increased to 150 after ageing treatment at 500° C. for 15 minutes. This means that they are stiffer than comparative alloy No. 26.

It is also noted that alloys Nos. 5 to 8 of this invention and comparative alloy No. 13 each containing more than 0.2 wt% of Co and also containing Sn are superior to alloys Nos. 1 to 4 in Vickers' hardness, stiffness, and resistance to repeated flexing.

Comparative alloy No. 13 containing Sn in excess of 2.0 wt% is very low in conductivity. Alloys Nos. 1 to 8 of this invention have a conductivity of 25% IACS or above, which is more than 10 times higher than that of comparative alloy No. 26.

TABLE 3

| | Heated at 850° C. for 5 minutes, and then cooled at a rate of 14° C./min | | | | | Heated at 850° C. for 5 minutes, cooled at a rate of 14° C./min, and ageing treatment at 500° C. for 15 min | | | | | |
|---|---|---|---|---|---|---|---|---|---|---|---|
| No. | Conductivity % IACS | Tensile strength kgf/mm² | Elongation % | Hardness Hv | Crystal grain size μm | Conductivity % IACS | Tensile strength kgf/mm² | Elongation % | Hardness Hv | Stiffness gf·cm | Repeated flexing cycles |
| 1 | 31.5 | 41.2 | 22.9 | 114 | 35 | 45.8 | 56.2 | 16.2 | 167 | 470 | 19.0 |
| 2 | 32.1 | 42.6 | 21.8 | 117 | 30 | 46.1 | 55.1 | 16.5 | 165 | 470 | 19.5 |
| 3 | 33.3 | 43.0 | 20.9 | 120 | 25 | 47.2 | 55.0 | 16.7 | 163 | 470 | 19.3 |
| 4 | 35.2 | 43.5 | 20.2 | 125 | 20 | 48.4 | 54.7 | 17.3 | 160 | 465 | 19.5 |
| 5 | 28.2 | 43.2 | 21.6 | 130 | 35 | 39.2 | 56.0 | 17.5 | 173 | 480 | 21.4 |
| 6 | 28.6 | 43.7 | 21.4 | 132 | 30 | 39.8 | 55.8 | 17.7 | 172 | 480 | 21.5 |
| 7 | 29.1 | 44.0 | 20.1 | 135 | 20 | 40.3 | 55.6 | 17.7 | 172 | 480 | 21.4 |
| 8 | 22.5 | 45.3 | 19.2 | 139 | 35 | 30.8 | 57.3 | 15.2 | 179 | 485 | 23.4 |
| 9* | 28.6 | 30.7 | 19.5 | 83 | 200 | 42.6 | 50.9 | 13.7 | 159 | 470 | 17.5 |
| 10* | 35.6 | 43.6 | 20.2 | 125 | 25 | 48.7 | 54.9 | 17.0 | 160 | 470 | 19.3 |
| 11* | 26.3 | 28.4 | 24.2 | 75 | 150 | 38.1 | 52.2 | 13.5 | 163 | 480 | 20.5 |
| 12* | 29.5 | 44.2 | 20.0 | 136 | 25 | 40.9 | 55.9 | 17.8 | 173 | 480 | 21.5 |
| 13* | 20.2 | 47.2 | 18.9 | 140 | 35 | 24.8 | 58.7 | 13.0 | 185 | 490 | 23.8 |
| 26* | 2.7 | 51.6 | 33.9 | 137 | 30 | 2.7 | 52.0 | 32.5 | 141 | 425 | 40 up |

*Comparative alloys

The effect of this invention is that the lead material for ceramic package ICs does not cause cracking to the ceramic substrate in the cooling step after silver soldering at 800° to 950° C., even though its coefficient of thermal expansion differs from that of ceramics. Moreover, it retains its high strength and conductivity after brazing.

What is claimed is:

1. A lead material for ceramic package ICs which consisting essentially of Ni 1.0–5.0 wt%, Co 0.2–1.0 wt%, Si 0.2–1.5 wt%, Zn 0.1–5.0 wt%, Cr 0.001–0.1 wt%, and Mn 0.02–1.0 wt%, with the remainder being Cu and inevitable impurities.

2. The lead material for ceramic package ICs of claim 1, wherein the content of Zn is 0.2 to 0.5 wt%.

3. The lead material for ceramic package ICs of claim 1 or claim 2, wherein the ratio of Ni content to Si content is 4.1 to 6.1.

4. The lead material for ceramic package ICs as set forth in further comprising Sn, wherein the content of Sn is less than 0.2 wt%.

5. The lead material for ceramic package ICs of claim 1, further comprising up to 0.2 wt. % of at least one member selected from the group consisting of Ag, Al, In, Fe and mixtures thereof or up to 0.1 wt. % of at least one member selected from the group consisting of B, Be, Mg, Ti, Zr, P and mixtures thereof.

6. A lead material for ceramic package ICs as set forth in claim 2, further comprising Sn, wherein the content of Sn is less than 0.2 wt%.

7. A lead material for ceramic package ICs as set forth in claim 3, further comprising Sn, wherein the content of Sn is less than 0.2 wt%.

* * * * *